(12) United States Patent  (10) Patent No.: US 8,111,569 B2
Lee et al.  (45) Date of Patent: Feb. 7, 2012

(54) LATCH STRUCTURE AND BIT LINE SENSE AMPLIFIER STRUCTURE INCLUDING THE SAME

(75) Inventors: Kang Seol Lee, Ichon (KR); Eun Souk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 128 days.

(21) Appl. No.: 12/644,979

(22) Filed: Dec. 22, 2009

(65) Prior Publication Data

US 2010/0097873 A1    Apr. 22, 2010

Related U.S. Application Data

(62) Division of application No. 11/963,434, filed on Dec. 21, 2007, now Pat. No. 7,646,651.

(30) Foreign Application Priority Data

Mar. 13, 2007 (KR) ................ 10-2007-0024460

(51) Int. Cl.
*G11C 7/00* (2006.01)
(52) U.S. Cl. ... 365/205; 365/207; 365/208; 365/189.05; 365/63
(58) Field of Classification Search .......... 365/205, 365/207, 208, 189.05, 63, 214
See application file for complete search history.

(56) References Cited

U.S. PATENT DOCUMENTS

| 6,288,950 | B1 | 9/2001 | Koike |
| 6,304,505 | B1 | 10/2001 | Forbes et al. |
| 6,477,100 | B2 | 11/2002 | Takemura et al. |
| 6,538,944 | B2 | 3/2003 | Choi |
| 6,925,020 | B2 | 8/2005 | Kwon |
| 7,002,862 | B2 * | 2/2006 | Kang ............................ 365/205 |
| 7,180,768 | B2 | 2/2007 | Kotabe et al. |
| 7,280,422 | B2 * | 10/2007 | Kim et al. ..................... 365/203 |
| 7,450,455 | B2 * | 11/2008 | Kang et al. .................... 365/208 |
| 7,646,651 | B2 * | 1/2010 | Lee et al. ................. 365/189.05 |
| 7,957,212 | B2 * | 6/2011 | Kang et al. .................... 365/222 |
| 2006/0023534 | A1 | 2/2006 | Do |
| 2006/0092735 | A1 | 5/2006 | Do et al. |

FOREIGN PATENT DOCUMENTS

| JP | 2006031922 | 2/2006 |
| KR | 1020050094678 A | 9/2005 |
| KR | 1020060021470 A | 3/2006 |

* cited by examiner

*Primary Examiner* — Viet Q Nguyen
(74) *Attorney, Agent, or Firm* — Baker & McKenzie LLP (57) ABSTRACT

A latch structure includes a first inverter that includes a first PMOS transistor and a first NMOS transistor, and a second inverter that includes a second PMOS transistor and a second NMOS transistor, receives an output signal of the first inverter, and outputs an input signal to the first inverter. The sources of the first and second transistors of the same type are connected to a common straight source line.

3 Claims, 7 Drawing Sheets

(PRIOR ART)

FIG.3

(PRIOR ART)

LATCH STRUCTURE AND BIT LINE SENSE AMPLIFIER STRUCTURE INCLUDING THE SAME

CROSS-REFERENCE TO RELATED PATENT APPLICATION

This application is a Divisional Application of U.S. patent application Ser. No. 11/963,434, titled "Latch Structure and Bit Line Sense Amplifier Structure Including the Same" filed Dec. 21, 2007, now U.S. Pat. No. 7,646,651 which is herein incorporated by reference in its entirety for all purposes, and which claims the benefit under 35 U.S.C. 119(a) of Korean Patent Application No. 10-2007-0024460, filed on Mar. 13, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to apparatus and methods for reducing the variation in output current of a bit line sense amplifier structure.

2. Related Art

A dynamic random access memory (DRAM) uses a sense amplifier to detect and amplify data stored in a memory cell. The sense amplifier is connected to bit lines of the memory cell, and compares the voltage level of a charge shared bit line with the pre-charge voltage of the bit line to discern memory cell data. A sense amplifier may be connected to one memory block to sense memory cells in the memory block, or it may be connected to two memory blocks to selectively sense memory cells in each of the two memory blocks.

Figure 1:
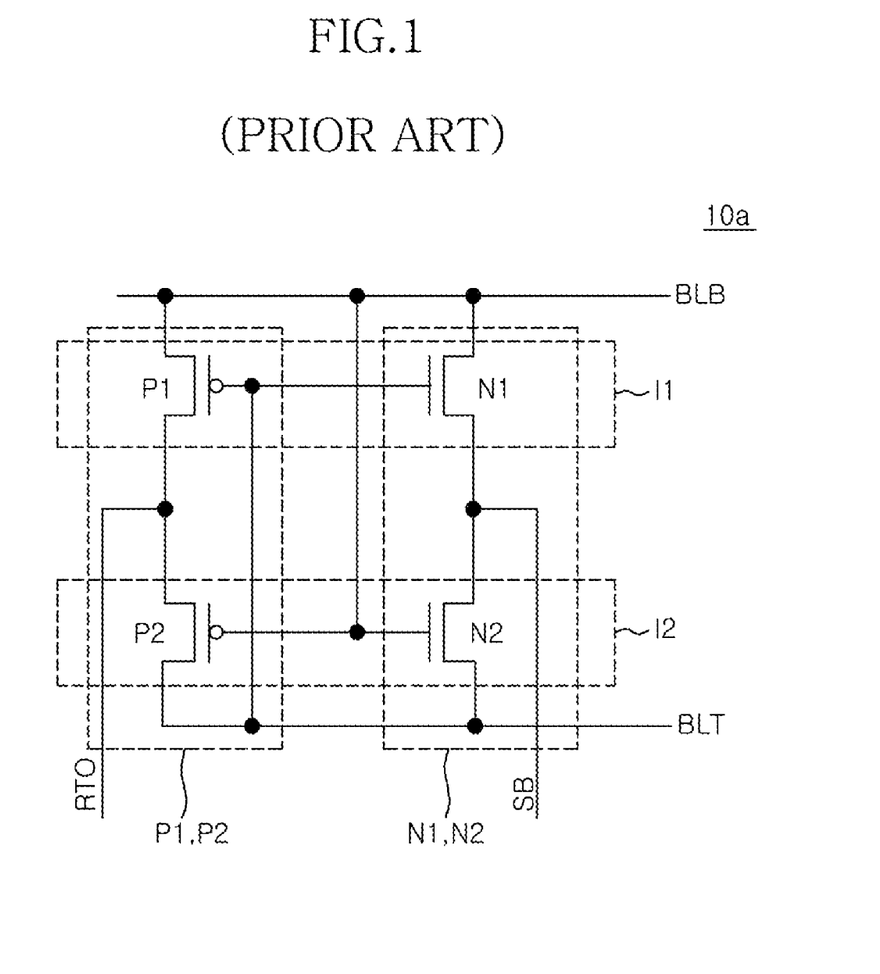
FIG. 1 is a circuit diagram illustrating a sense amplifying unit of a general bit line sense amplifier.

As shown in FIG. 1, a general bit line sense amplifier includes, as a main component, a sense amplifying unit 10a having two pairs of CMOS inverters I1 and I2 connected to each other in a latch structure.

In such a bit line sense amplifier, when a word line (not shown) is activated, signals are transmitted from a memory cell (not shown) to the sense amplifying unit 10a through a pair of bit lines BLT and BLB. The levels of an RTO signal line and an SB signal line that are maintained at a predetermined voltage (for example, Vcore/2) selectively increase and decrease, which makes it possible for the sense amplifying unit 10a to perform a sensing operation. Accordingly, the bit line BLT changes to a level Vcore (or a level Vss), and the bit line bar BLB changes to the level Vss (or the level Vcore). The RTO signal line and the SB signal line are connected to a bit line sense amplifier driving circuit that is provided in the bit line sense amplifier.

Figure 2:
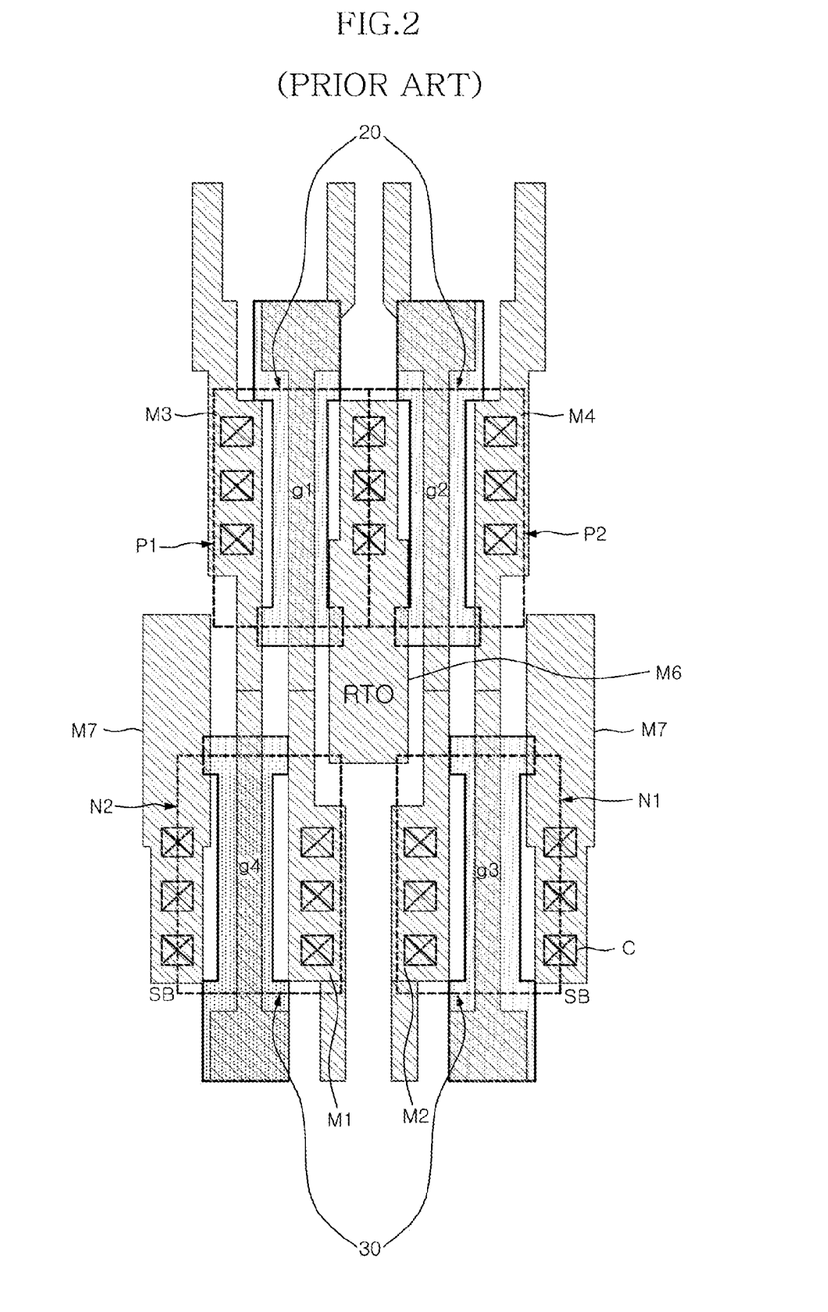
FIG. 2 is a plan view illustrating the sense amplifying unit shown in FIG. 1 that is mounted on a substrate.

FIG. 2 is a plan view illustrating the sense amplifying unit 10a of FIG. 1 integrated on a substrate.

Referring to FIG. 2, a PMOS active region 20 and an NMOS active region 30 are provided on a semiconductor substrate (not shown). Gate electrodes g1 and g2, and gate electrodes g3 and g4 are provided in the PMOS active region 20 and the NMOS active region 30, respectively, and source and drain regions (not shown) are formed in the active regions 20 and 30 at both sides of each of the gate electrodes g1, g2, g3, and g4.

A first line M1 is formed such that the gate electrode g1 of the first PMOS transistor P1 forming the first inverter I1 is connected to the drain of the second NMOS transistor N2 forming the second inverter I2, and a second line M2 is formed such that the gate electrode g2 of the second PMOS transistor P2 forming the second inverter I2 is connected to the drain of the first NMOS transistor N1 forming the first inverter I1. In addition, a third line M3 is formed such that the gate electrode g3 of the first NMOS transistor N1 is connected to the drain of the second PMOS transistor P2, and a fourth line M4 is formed such that the gate electrode g4 of the second NMOS transistor N2 is connected to the drain of the first PMOS transistor P1.

The first and second PMOS transistors P1 and P2 are symmetrical with respect to a vertical axis such that they share one source region, and an RTO line M6 is connected to the common source of the first and second PMOS transistors P1 and P2. Meanwhile, unlike the PMOS transistors, the sources of the first and second NMOS transistors N1 and N2 are independently formed, and SB lines M7 are connected to the sources of the first and second NMOS transistors N1 and N2, respectively. In FIG. 2, a character 'C' indicates contact portions between the regions of the transistors and the lines.

When the sense amplifying unit is arranged and formed on the semiconductor substrate, a mask for manufacturing the transistors may be misaligned, which may cause the gates g1, g2, g3, and g4 to be shifted, or the contact portions C to be shifted in a predetermined direction. When one or more of the gates g1, g2, g3, and g4 are shifted, and/or one or more of the contact portions C are shifted in a predetermined direction, output currents from the transistors may be different from each other.

It is known that a MOS transistor has different drain currents Ids in a linear region and a saturation-region. The drain currents Ids in each region are defined as follows:

$$Ids_{Linear} = \{(Vgs-Vt) \cdot Vds - Vds^2/2\}, \text{ and}$$

$$Id_{Saturation} = (Vgs-Vt)^2, \tag{1}$$

where Vgs indicates a gate-source voltage, Vt indicates a threshold voltage, and Vds indicates a drain-source voltage.

In equation (1), the different drain currents in the linear region and the saturation-region are defined as a function of Vgs. As described above, when the position of the gate electrode is changed, the gate-source voltage Vgs is also changed, which causes the output currents of the MOS transistors to differ from each other.

For example, when the gate electrodes g1 and g2 of the first and second PMOS transistors P1 and P2 are shifted toward the left side of the drawing by a predetermined distance due to a manufacturing error (or variable), the distance between the gate electrode and the source region of the first PMOS transistor P1 increases, and the drain current is reduced. On the other hand, the distance between the gate electrode and the source region of the second PMOS transistor P2 decreases, and the drain current increases. Therefore, different currents (drain currents) are output from the PMOS transistors, which is not preferable.

Similarly, when the gate electrodes g3 and g4 of the first and second NMOS transistors N1 and N2 are shifted toward the left side (or the right side) of the drawing due to a manufacturing error, the distance between the gate electrode and the source region of the first NMOS transistor N1 decreases, and the drain current increases. On the other hand, the distance between the gate electrode and the source region of the second NMOS transistor N2 increases, and the drain current increases. Therefore, different currents (drain currents) are output from the NMOS transistors, which is not preferable.

As described above, when the gate electrodes g3 and g4 of the first and second NMOS transistors N1 and N2 are shifted toward the left side of the drawing, the positions of the drains of the first and second PMOS transistors P1 and P2 respectively connected to the gate electrodes g3 and g4 are changed. Therefore, in the first PMOS transistor P1, the distance between the gate electrode and the drain increases, and in the second PMOS transistor P2, the distance between the gate electrode and the drain decreases. As a result, an error in the drain current occurs in the PMOS transistors.

Figure 3:
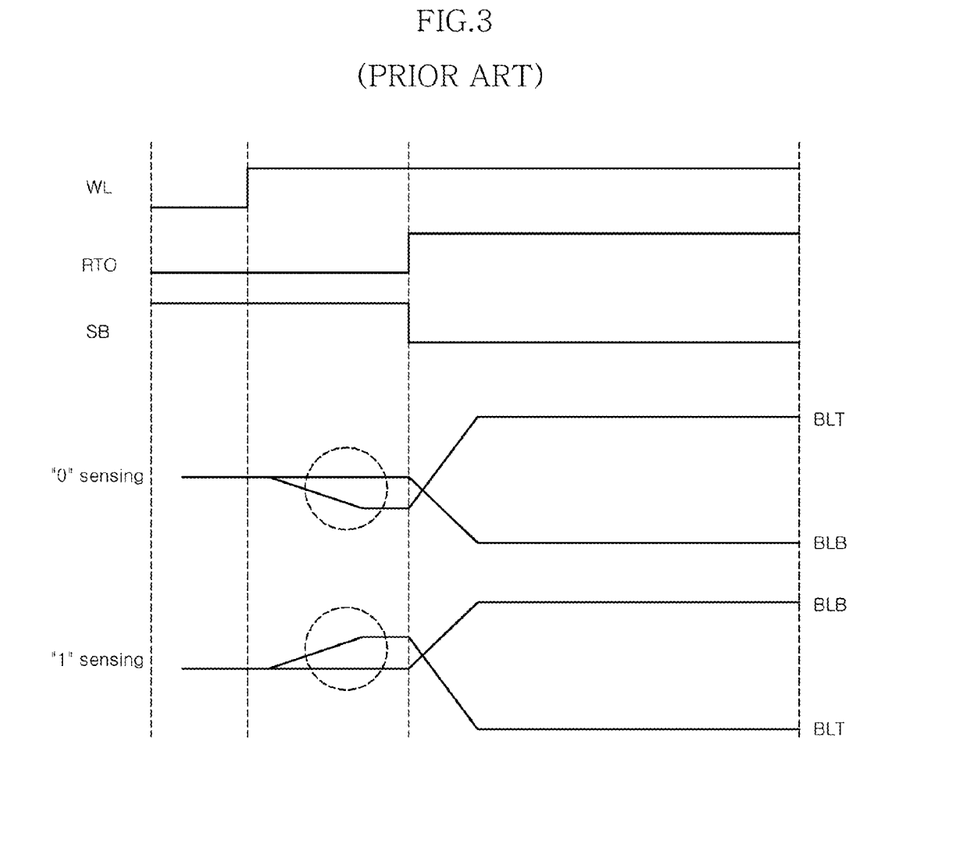
FIG. 3 is a timing chart illustrating a sensing error of the sense amplifying unit of FIGS. 1 and 2.

Such mismatches and/or errors formed in the transistors forming the sense amplifying unit can cause a resulting sense amplification error as illustrated by the circled areas of the graph illustrated in FIG. 3. That is, when the charge shared bit line BLT should be sensed at a low level of "0", the charge shared bit line BLT may be sensed at a high level of "1" due to errors in the output currents of the transistors. Similarly, when the charge shared bit line BLT should be sensed at a high level of "1", the charge shared bit line BLT may be sensed at a low level of "0" due to errors in the output currents of the transistors.

SUMMARY

A latch structure is capable of reducing a variation in output current even when electrode lines are misaligned due to a manufacturing error. The latch structure can be included in a bit line sense amplifier structure capable of preventing a sensing error.

According to one aspect, the latch structure can include a first inverter that includes a first PMOS transistor and a first NMOS transistor, and a second inverter that includes a second PMOS transistor and a second NMOS transistor, receives an output signal of the first inverter, and outputs an input signal to the first inverter. In the latch structure, sources of the first and second transistors of the same type are connected to a common straight source line.

According to another aspect, a bit line sense amplifier structure can include a sense amplifying unit that can include a first inverter and a second inverter. In the bit line sense amplifier structure, the first inverter can include a first PMOS transistor and a first NMOS transistor, and the second inverter can be connected to the first inverter in a latch form and can include a second PMOS transistor and a second NMOS transistor. The first and second PMOS transistors can be provided adjacent to each other in a longitudinal direction, and sources of the first and second PMOS transistors can be connected to a straight RTO line. The first and second NMOS transistors can also bee provided adjacent to each other in the longitudinal direction, and sources of the first and second NMOS transistors can be connected to a straight SB line.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Certain embodiments described herein relate to a latch structure in which one or more of the same type transistors are arranged in the vertical direction and sources of the transistors are connected to a common straight wiring line. In transistors of the same type forming the latch, the distance between a gate electrode and a source line is fixed, even when a mask is misaligned. Accordingly, it is possible to supply a constant output current (drain current), and obtain more accurate sensing results.

Figure 4:
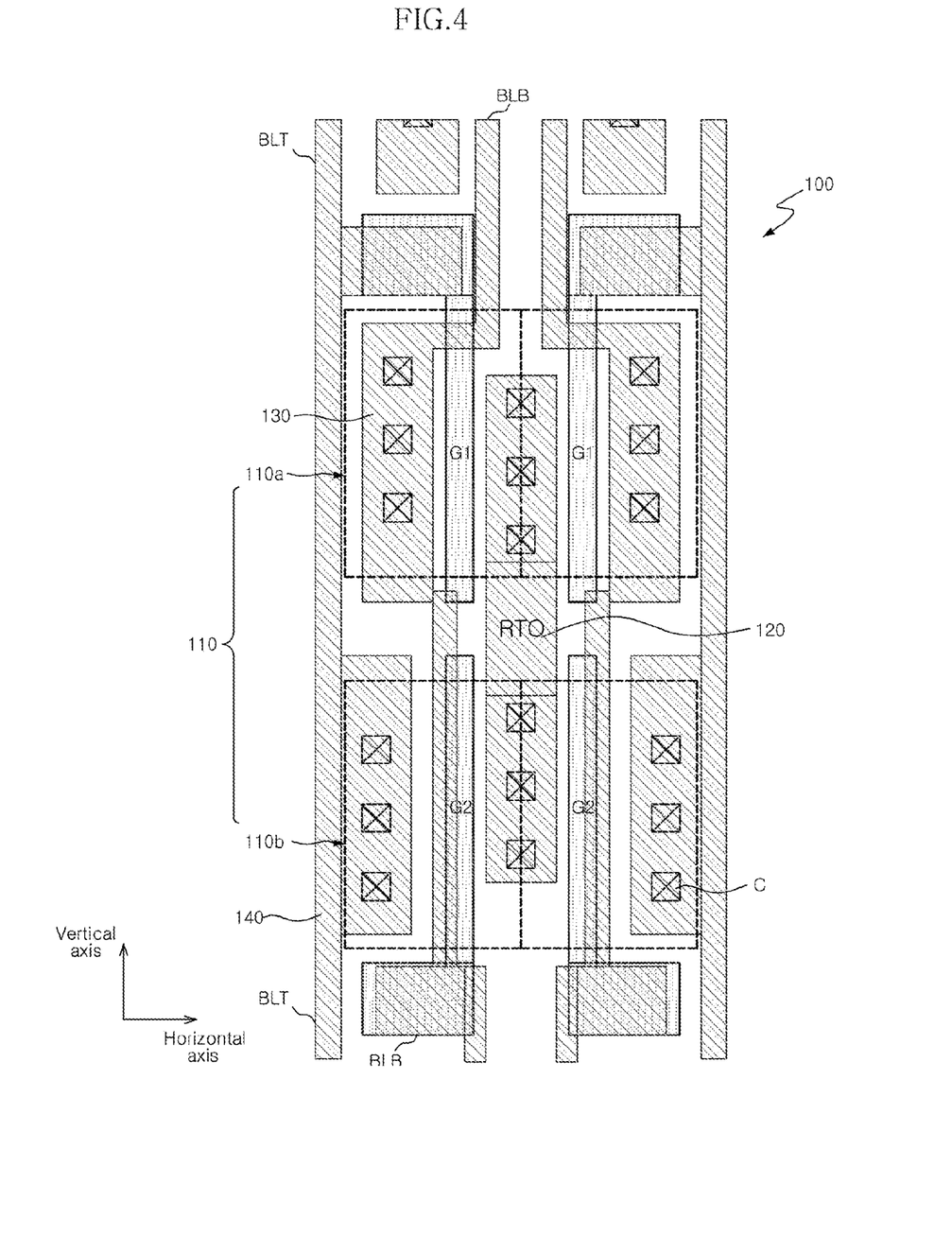
FIG. 4 is a plan view illustrating an example sense amplifying unit of a bit line sense amplifier according to one embodiment.

FIG. 4. is a diagram illustrating an example sense amplifying unit in accordance with one embodiment. Referring to FIG. 4, a PMOS active region 110 in which a PMOS transistors can be formed is defined on a semiconductor substrate 100. The PMOS active region 110 can be divided into a first PMOS active region 110a in which a first PMOS transistor P1, e.g., as shown in FIG. 1, can be formed and a second PMOS active region 110b in which a second PMOS transistor P2 can be formed. The first and second PMOS active regions 110a and 110b can be arranged adjacent to each other such that they are symmetrical with respect to a horizontal axis (on the plane). In this case, when a layout area is considered, a PMOS active region forming a sense amplifying unit of another bit line sense amplifier can be arranged adjacent to the first and second PMOS active regions 110a and 110b such that they are symmetrical to a folding line thereof with respect to a vertical axis.

In the example of FIG. 4, gate electrodes G1 and G2 can be provided on the first and second PMOS active regions 110a and 110b, respectively. The gate electrodes G1 and G2 can be provided at the centers of the first and second PMOS active regions 110a and 110b so as to cross the first and second PMOS active regions 110a and 110b. Since the gate electrodes G1 and G2 are defined by one mask, the two gate electrodes G1 and G2 are shifted in the same direction and have the same gap even when the mask is misaligned due to manufacturing conditions.

P-type impurities, such as boron, can be implanted into the PMOS active regions 110 at both sides of each of the gate electrodes G1 and G2 to form source and drain regions (not shown). In this way, the first and second PMOS transistors P1 and P2 are formed.

An RTO line 120 can be provided on the source regions of the first and second PMOS transistors P1 and P2. The RTO line 120 can be formed in a straight line so as to pass through both the source of the first PMOS transistor P1 and the source of the second PMOS transistor P2. That is, the sources of the first and second PMOS transistors P1 and P2 can share one RTO line 120.

A first line 130 connected to a bit line bar BLB can be arranged on the drain of the first PMOS transistor P1, and a second line 140 connected to a bit line BLT can be arranged on the drain of the second PMOS transistor P2.

In FIG. 4, a character 'C' denotes contact portions between the wiring lines and conductive regions (for example, the source and the drain).

As described above, the source regions of the first and second PMOS transistors P1 and P2 forming the sense amplifying unit of the bit line sense amplifier can share one RTO line 120. Therefore, even when the position of a mask, for example an active mask, or the positions of the gate electrodes G1 and G2 are changed, the distances between the gate electrodes G1 and G2 of the two PMOS transistors P1 and P2 and the RTO line 120 remain fixed. As a result, the drain current values of the two PMOS transistors P1 and P2 can be different from the design values thereof, but they will have the same drain current (output current).

Figure 5:
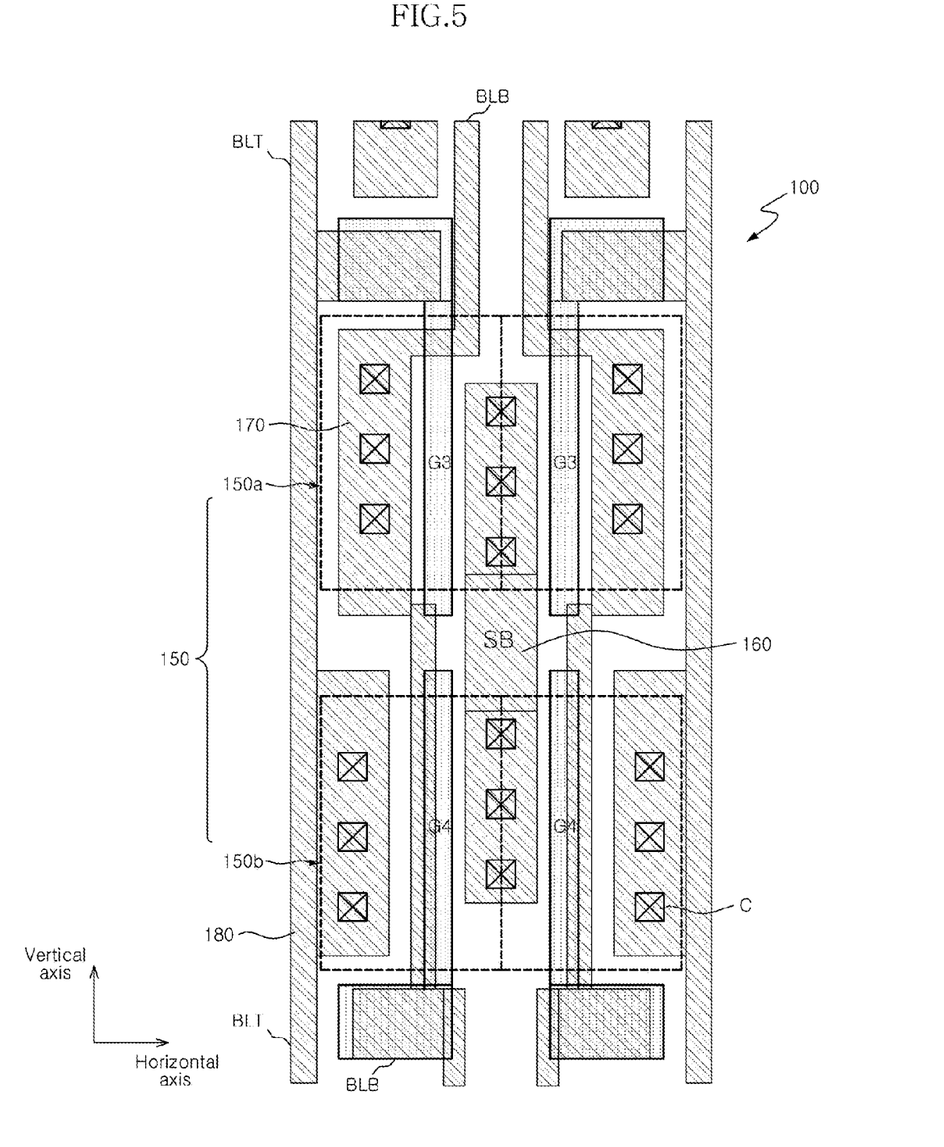
FIG. 5 is a plan view illustrating an example sense amplifying unit of a bit line sense amplifier according to another embodiment.

Meanwhile, as shown in FIG. 5, an NMOS active region 150 in which NMOS transistors can be formed is defined on the semiconductor substrate 100. The NMOS active region 150 can be divided into a first NMOS active region 150a in which a first NMOS transistor N1, e.g., as shown in FIG. 1, can be formed and a second NMOS active region 150b in which a second NMOS transistor N2 can be formed. As illustrated, the first and second NMOS active regions 150a and 150b can be arranged adjacent to each other such that they are symmetrical with respect to a horizontal axis on the plane. In this case, when a layout area is considered, an NMOS active region forming a sense amplifying unit of another bit line sense amplifier can be arranged adjacent to the first and second NMOS active regions 150a and 150b such that they are symmetrical to a folding line thereof with respect to a vertical axis.

Gate electrodes G3 and G4 can be provided on the first and second NMOS active regions 150a and 150b, respectively. The gate electrodes G3 and G4 can be provided at the centers of the first and second NMOS active regions 150a and 150b so as to cross the first and second NMOS active regions 150a and 150b, similar to the gate electrodes G1 and G2 of the first and second PMOS transistors illustrated in FIG. 4. Similarly, since the gate electrodes G3 and G4 of the first and second NMOS transistors N1 and N2 can be defined by one mask, the two gate electrodes G3 and G4 are shifted in the same direction and have the same gap even when the mask is misaligned due to the manufacturing conditions.

N-type impurities, such as phosphorus (P) or arsenic (As), can be implanted into the NMOS active regions 150a and 150b at both sides of each of the gate electrodes G3 and G4 to form source and drain regions (not shown). In this way, the first and second NMOS transistors N1 and N2 are formed.

A straight SB line 160 can be provided directly on the source regions of the first and second NMOS transistors N1 and N2. The SB line 160 can be formed so as to pass through both the source of the first NMOS transistor N1 and the source of the second NMOS transistor N2. That is, the sources of the first and second NMOS transistors N1 and N2 can share one SB line 160.

A third line 170 connected to a bit line bar BLB can be arranged on the drain of the first NMOS transistor N1, and a fourth line 180 connected to a bit line BLT can be arranged on the drain of the second NMOS transistor N2.

In FIG. 5, a character 'C' denotes contact portions between the wiring lines and the regions.

As described above, the source regions of the first and second NMOS transistors N1 and N2 forming the sense amplifying unit of the bit line sense amplifier can share one SB line 160. Therefore, even when the position of a mask, for example an active mask, or the positions of the gate electrodes G3 and G4 are changed, the distances between the gate electrodes G3 and G4 of the two NMOS transistors N1 and N2 and the SB line 160 are fixed. As a result, the drain current values of the two NMOS transistors N1 and N2 may be different from the design values thereof, but they will have the same drain current (output current).

That is, according to certain embodiments, the first and second PMOS transistors P1 and P2, and/or the first and second NMOS transistors N1 and N2 forming a sense amplifying unit having a latch structure can be arranged adjacent to each other in the vertical direction on the plane. In addition, a straight RTO line 120 can be arranged on the sources of the first and second PMOS transistors P1 and P2 so as to be connected thereto, and a straight SB line 160 can be arranged on the sources of the first and second NMOS transistors N1 and N2 so as to be connected thereto.

In this way, for example, even when an active mask, gate electrodes, or a contact mask is misaligned, the distance between the gate electrodes or the source electrodes of the two PMOS transistors, or the gate electrodes or the source electrodes of the two NMOS transistors is fixed, which makes it possible to ensure the same gate or source voltage. As a result, the PMOS transistors or the NMOS transistors will have the same drain current. That is, the drain currents of a pair of PMOS transistors or a pair of NMOS transistors increase or decrease at the same time, which makes it possible to maintain accurate functioning of the latch.

Figure 6:
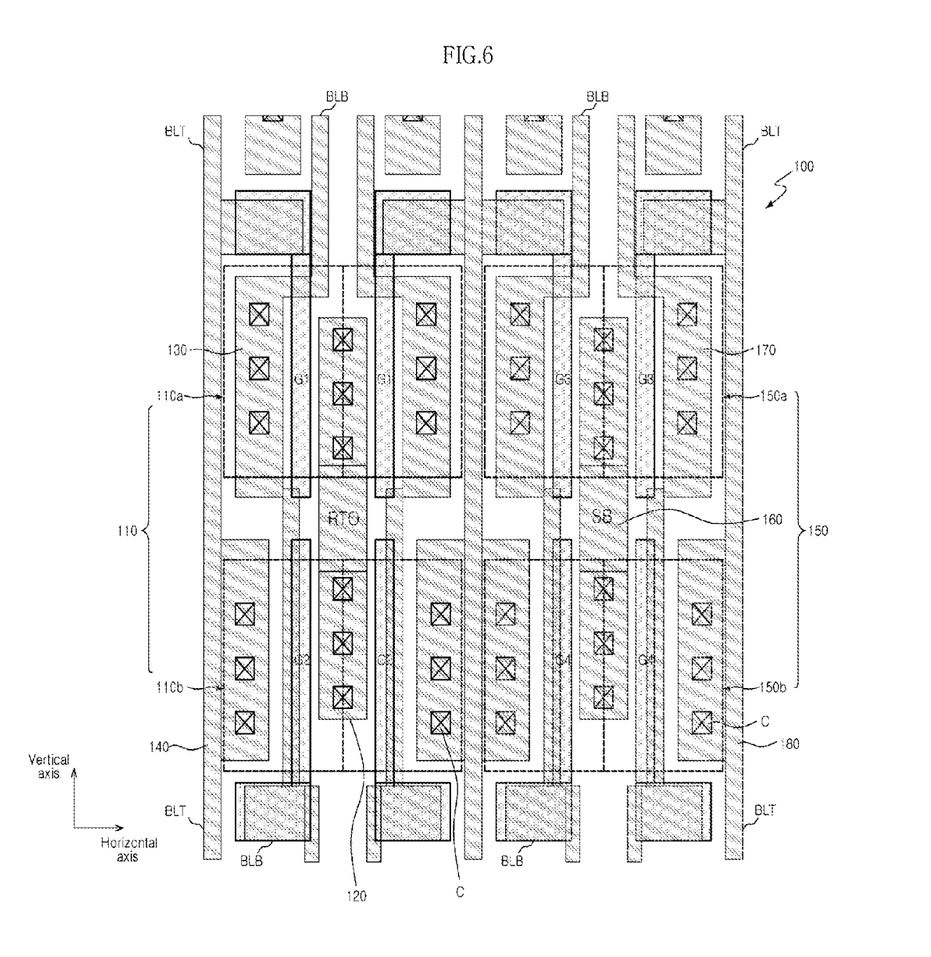
FIG. 6 is a diagram illustrating the sense amplifiers of FIGS. 4 and 5 side by side.

FIG. 6 is a diagram illustrating the sense amplifiers of FIGS. 4 and 5 side by side.

3. Experimental Example

Figure 7:
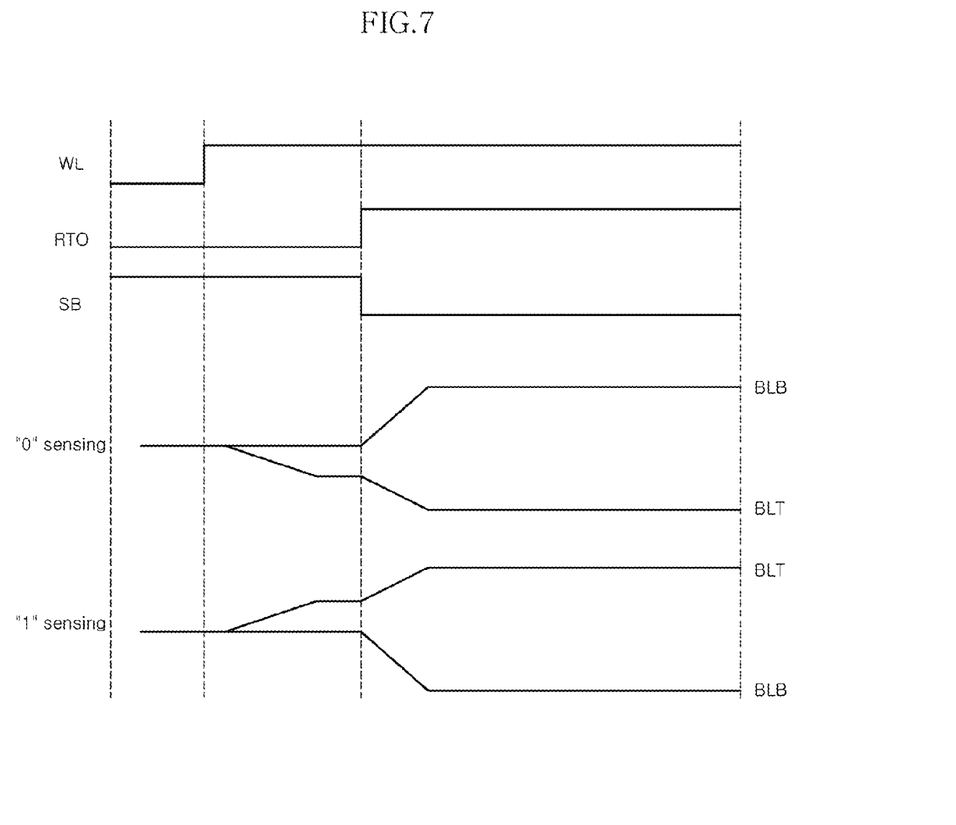
FIG. 7 is a timing chart illustrating example experimental timing results for the sense amplifying units of FIGS. 4 and 5.

FIG. 7 is a graph illustrating sensing data when a sense amplifying unit configured in accordance with the embodiments described herein amplifies input signals. This example shows the sensing state of a bit line when the gate electrodes of the PMOS transistors or the NMOS transistors are shifted at a predetermined distance.

As described above, even when the gate electrodes of the PMOS transistors or the NMOS transistors are shifted at a predetermined distance, the bit line BLT and the bit line bar BLB will have the same signal levels "0" and "1" (or "1" and "0") via charge sharing during a word line select. As a result, even when a mask is misaligned, it is possible to obtain an accurate sensing value.

It will be apparent to those skilled in the art that various modifications and changes may be made without departing from the scope and spirit of the embodiments described herein. Therefore, it should be understood that the above embodiments are not intended to be limiting, but rather are illustrative in all aspects. Thus, the scope of the claims should not be unduly limited by the description preceding them, and all changes and modifications that fall within metes and bounds of the claims, or equivalents of such metes and bounds are intended to be embraced by the claims.

What is claimed is:

1. A bit line sense amplifier structure comprising a sense amplifying unit, the sense amplifying unit including:
   a first inverter that includes a first PMOS transistor and a first NMOS transistor; and
   a second inverter coupled with the first inverter and including a second PMOS transistor and a second NMOS transistor,
   wherein the first and second PMOS transistors are provided adjacent to each other in a longitudinal direction, and the sources of the first and second PMOS transistors contact a straight RTO line,
   and wherein the RTO line is provided on the sources of the first and second PMOS transistors, and the length of the RTO line is smaller than the overall length of the first or second PMOS transistor.

2. The bit line sense amplifier of claim 1, wherein the first and second NMOS transistors are provided adjacent to each other in the longitudinal direction, and the sources of the first and second NMOS transistors contact a straight SB line.

3. The bit line sense amplifier structure of claim 2, wherein the SB line is provided on the sources of the first and second NMOS transistors, and the length of the SB line is smaller than the overall length of the first or second NMOS transistor.

* * * * *